(12) United States Patent
Berger et al.

(10) Patent No.: US 10,891,997 B2
(45) Date of Patent: Jan. 12, 2021

(54) MEMORY ARRAY WITH HORIZONTAL SOURCE LINE AND A VIRTUAL SOURCE LINE

(71) Applicant: SPIN MEMORY, Inc., Fremont, CA (US)

(72) Inventors: Neal Berger, Cupertino, CA (US); Mourad El Baraji, Fremont, CA (US); Lester Crudele, Tomball, TX (US); Benjamin Louie, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/857,241

(22) Filed: Dec. 28, 2017

(65) Prior Publication Data

US 2019/0206471 A1    Jul. 4, 2019

(51) Int. Cl.
   *G11C 11/16*    (2006.01)
(52) U.S. Cl.
   CPC ...... *G11C 11/1675* (2013.01); *G11C 11/1655* (2013.01); *G11C 11/1659* (2013.01); *G11C 11/1697* (2013.01)
(58) Field of Classification Search
   CPC ............ G11C 11/1675; G11C 11/1659; G11C 11/1655; G11C 11/1697
   See application file for complete search history.

(56) References Cited

U.S. PATENT DOCUMENTS

| | | | |
|---|---|---|---|
| 4,597,487 A | 7/1986 | Crosby et al. | |
| 5,541,868 A | 7/1996 | Prinz | |
| 5,559,952 A | 9/1996 | Fujimoto | |
| 5,629,549 A | 5/1997 | Johnson | |
| 5,640,343 A | 6/1997 | Gallagher et al. | |
| 5,654,566 A | 8/1997 | Johnson | |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

*Primary Examiner* — Vanthu T Nguyen

(57) ABSTRACT

An memory device comprising an array of memory cells wherein each memory cell includes a respective magnetic random access memory (MRAM) element, and a respective gating transistor. A plurality of bit lines are routed parallel to each other, wherein each bit line is associated with a respective memory cell of the array of memory cells. A common word line is coupled to gates of gating transistors of the array of memory cells. A common source line is coupled to sources of the gating transistors, wherein the common source line is routed perpendicular to the plurality of bit lines within the array of memory cells. A first circuit provides a first voltage on an addressed bit line of the plurality of bit lines during a write cycle, wherein the addressed bit line corresponds to an addressed memory cell. A second circuit provides a second voltage on remainder bits lines of the plurality of bit lines, wherein the second voltage is operable to be applied to the common source line, via the remainder bit lines, during the write cycle.

19 Claims, 19 Drawing Sheets

(56) References Cited

U.S. PATENT DOCUMENTS

| | | |
|---|---|---|
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Gun |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |

(56) References Cited

U.S. PATENT DOCUMENTS

| | | | |
|---|---|---|---|
| 7,773,439 B2 | 8/2010 | Do et al. | |
| 7,776,665 B2 | 8/2010 | Izumi et al. | |
| 7,796,439 B2 | 9/2010 | Arai | |
| 7,810,017 B2 | 10/2010 | Radke | |
| 7,821,818 B2 | 10/2010 | Dieny et al. | |
| 7,852,662 B2 | 12/2010 | Yang | |
| 7,861,141 B2 | 12/2010 | Chen | |
| 7,881,095 B2 | 2/2011 | Lu | |
| 7,911,832 B2 | 3/2011 | Kent et al. | |
| 7,916,515 B2 | 3/2011 | Li | |
| 7,936,595 B2 | 5/2011 | Han et al. | |
| 7,936,598 B2 | 5/2011 | Zheng et al. | |
| 7,983,077 B2 | 7/2011 | Park | |
| 7,986,544 B2 | 7/2011 | Kent et al. | |
| 8,008,095 B2 | 8/2011 | Assefa et al. | |
| 8,028,119 B2 | 9/2011 | Miura | |
| 8,041,879 B2 | 10/2011 | Erez | |
| 8,055,957 B2 | 11/2011 | Kondo | |
| 8,058,925 B2 | 11/2011 | Rasmussen | |
| 8,059,460 B2 | 11/2011 | Jeong et al. | |
| 8,072,821 B2 | 12/2011 | Arai | |
| 8,077,496 B2 | 12/2011 | Choi | |
| 8,080,365 B2 | 12/2011 | Nozaki | |
| 8,088,556 B2 | 1/2012 | Nozaki | |
| 8,094,480 B2 | 1/2012 | Tonomura | |
| 8,102,701 B2 | 1/2012 | Prejbeanu et al. | |
| 8,105,948 B2 | 1/2012 | Zhong et al. | |
| 8,120,949 B2 | 2/2012 | Ranjan et al. | |
| 8,143,683 B2 | 3/2012 | Wang et al. | |
| 8,144,509 B2 * | 3/2012 | Jung | G11C 11/1655 365/171 |
| 8,148,970 B2 | 4/2012 | Fuse | |
| 8,159,867 B2 | 4/2012 | Cho et al. | |
| 8,201,024 B2 | 6/2012 | Burger | |
| 8,223,534 B2 | 7/2012 | Chung | |
| 8,255,742 B2 | 8/2012 | Ipek | |
| 8,278,996 B2 | 10/2012 | Miki | |
| 8,279,666 B2 | 10/2012 | Dieny et al. | |
| 8,295,073 B2 | 10/2012 | Norman | |
| 8,295,082 B2 | 10/2012 | Chua-Eoan | |
| 8,334,213 B2 | 12/2012 | Mao | |
| 8,345,474 B2 | 1/2013 | Oh | |
| 8,349,536 B2 | 1/2013 | Nozaki | |
| 8,362,580 B2 | 1/2013 | Chen et al. | |
| 8,363,465 B2 | 1/2013 | Kent et al. | |
| 8,374,050 B2 | 2/2013 | Zhou et al. | |
| 8,386,836 B2 | 2/2013 | Burger | |
| 8,415,650 B2 | 4/2013 | Greene | |
| 8,416,620 B2 | 4/2013 | Zheng et al. | |
| 8,422,286 B2 | 4/2013 | Ranjan et al. | |
| 8,422,330 B2 | 4/2013 | Hatano et al. | |
| 8,432,727 B2 * | 4/2013 | Ryu | G11C 11/1675 365/148 |
| 8,441,844 B2 | 5/2013 | El Baraji | |
| 8,456,883 B1 | 6/2013 | Liu | |
| 8,456,926 B2 | 6/2013 | Ong et al. | |
| 8,477,530 B2 | 7/2013 | Ranjan et al. | |
| 8,492,881 B2 | 7/2013 | Kuroiwa et al. | |
| 8,495,432 B2 | 7/2013 | Dickens | |
| 8,535,952 B2 | 9/2013 | Ranjan et al. | |
| 8,539,303 B2 | 9/2013 | Lu | |
| 8,542,524 B2 | 9/2013 | Keshtbod et al. | |
| 8,549,303 B2 | 10/2013 | Fifield et al. | |
| 8,558,334 B2 | 10/2013 | Ueki et al. | |
| 8,559,215 B2 | 10/2013 | Zhou et al. | |
| 8,574,928 B2 | 11/2013 | Satoh et al. | |
| 8,582,353 B2 | 11/2013 | Lee | |
| 8,590,139 B2 | 11/2013 | Op DeBeeck et al. | |
| 8,592,927 B2 | 11/2013 | Jan | |
| 8,593,868 B2 * | 11/2013 | Park | G11C 7/02 365/185.11 |
| 8,609,439 B2 | 12/2013 | Prejbeanu et al. | |
| 8,617,408 B2 | 12/2013 | Balamane | |
| 8,625,339 B2 | 1/2014 | Ong | |
| 8,634,232 B2 | 1/2014 | Oh | |
| 8,667,331 B2 | 3/2014 | Hori | |
| 8,687,415 B2 | 4/2014 | Parkin et al. | |
| 8,705,279 B2 | 4/2014 | Kim | |
| 8,716,817 B2 | 5/2014 | Saida | |
| 8,716,818 B2 | 5/2014 | Yoshikawa et al. | |
| 8,722,543 B2 | 5/2014 | Belen | |
| 8,737,137 B1 | 5/2014 | Choy et al. | |
| 8,755,222 B2 | 6/2014 | Kent et al. | |
| 8,779,410 B2 | 7/2014 | Sato et al. | |
| 8,780,617 B2 * | 7/2014 | Kang | G11C 29/12005 365/158 |
| 8,792,269 B1 | 7/2014 | Abedifard | |
| 8,802,451 B2 | 8/2014 | Malmhall | |
| 8,810,974 B2 | 8/2014 | Noel et al. | |
| 8,817,525 B2 | 8/2014 | Ishihara | |
| 8,832,530 B2 | 9/2014 | Pangal et al. | |
| 8,852,760 B2 | 10/2014 | Wang et al. | |
| 8,853,807 B2 | 10/2014 | Son et al. | |
| 8,860,156 B2 | 10/2014 | Beach et al. | |
| 8,862,808 B2 | 10/2014 | Tsukamoto et al. | |
| 8,867,258 B2 | 10/2014 | Rao | |
| 8,883,520 B2 | 11/2014 | Satoh et al. | |
| 8,902,628 B2 | 12/2014 | Ha | |
| 8,966,345 B2 | 2/2015 | Wilkerson | |
| 8,987,849 B2 | 3/2015 | Jan | |
| 9,019,754 B1 | 4/2015 | Bedeschi | |
| 9,025,378 B2 | 5/2015 | Tokiwa | |
| 9,026,889 B2 | 5/2015 | Kwok | |
| 9,030,899 B2 | 5/2015 | Lee | |
| 9,036,407 B2 | 5/2015 | Wang et al. | |
| 9,037,812 B2 | 5/2015 | Chew | |
| 9,043,674 B2 | 5/2015 | Wu | |
| 9,070,441 B2 | 6/2015 | Otsuka et al. | |
| 9,070,855 B2 | 6/2015 | Gan et al. | |
| 9,076,530 B2 | 7/2015 | Gomez et al. | |
| 9,082,888 B2 | 7/2015 | Kent et al. | |
| 9,104,581 B2 | 8/2015 | Fee et al. | |
| 9,104,595 B2 | 8/2015 | Sah | |
| 9,130,155 B2 | 9/2015 | Chepulskyy et al. | |
| 9,136,463 B2 | 9/2015 | Li | |
| 9,140,747 B2 | 9/2015 | Kim | |
| 9,165,629 B2 | 10/2015 | Chih | |
| 9,165,787 B2 | 10/2015 | Kang | |
| 9,166,155 B2 | 10/2015 | Deshpande | |
| 9,178,958 B2 | 11/2015 | Lindamood | |
| 9,189,326 B2 | 11/2015 | Kalamatianos | |
| 9,190,471 B2 | 11/2015 | Yi et al. | |
| 9,196,332 B2 | 11/2015 | Zhang et al. | |
| 9,229,353 B2 | 1/2016 | Khan | |
| 9,229,806 B2 | 1/2016 | Mekhanik et al. | |
| 9,231,191 B2 | 1/2016 | Huang et al. | |
| 9,245,608 B2 | 1/2016 | Chen et al. | |
| 9,250,990 B2 | 2/2016 | Motwani et al. | |
| 9,250,997 B2 | 2/2016 | Kim et al. | |
| 9,251,896 B2 | 2/2016 | Ikeda | |
| 9,257,165 B2 * | 2/2016 | Andre | G06F 12/0806 |
| 9,257,483 B2 | 2/2016 | Ishigaki | |
| 9,263,667 B1 | 2/2016 | Pinarbasi | |
| 9,286,186 B2 | 3/2016 | Weiss | |
| 9,298,552 B2 | 3/2016 | Leem | |
| 9,299,412 B2 | 3/2016 | Naeimi | |
| 9,317,429 B2 | 4/2016 | Ramanujan | |
| 9,324,457 B2 | 4/2016 | Takizawa | |
| 9,337,412 B2 | 5/2016 | Pinarbasi et al. | |
| 9,341,939 B1 | 5/2016 | Yu et al. | |
| 9,342,403 B2 | 5/2016 | Keppel et al. | |
| 9,349,482 B2 | 5/2016 | Kim et al. | |
| 9,351,899 B2 | 5/2016 | Bose et al. | |
| 9,362,486 B2 | 6/2016 | Kim et al. | |
| 9,378,817 B2 | 6/2016 | Kawai | |
| 9,379,314 B2 | 6/2016 | Park et al. | |
| 9,389,954 B2 | 7/2016 | Pelley et al. | |
| 9,396,065 B2 | 7/2016 | Webb et al. | |
| 9,396,991 B2 | 7/2016 | Arvin et al. | |
| 9,401,336 B2 | 7/2016 | Arvin et al. | |
| 9,406,376 B2 | 8/2016 | Pinarbasi | |
| 9,406,876 B2 | 8/2016 | Pinarbasi | |
| 9,418,721 B2 | 8/2016 | Bose | |
| 9,431,084 B2 | 8/2016 | Bose et al. | |

(56) References Cited

U.S. PATENT DOCUMENTS

| | | |
|---|---|---|
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowbum |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2018/0033957 A1 | 2/2018 | Zhang |

(56) References Cited

U.S. PATENT DOCUMENTS

| | | |
|---|---|---|
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB-MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2005, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

MEMORY ARRAY WITH HORIZONTAL SOURCE LINE AND A VIRTUAL SOURCE LINE

FIELD OF THE INVENTION

The present invention is generally related to memory systems that can be used by computer systems.

BACKGROUND OF THE INVENTION

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction (MTJ).

MRAM devices can store information by changing the orientation of the magnetization of the free layer of the MTJ. In particular, based on whether the free layer is in a parallel or anti-parallel alignment relative to the reference layer, either a one or a zero can be stored in each MRAM cell. Due to the spin-polarized electron tunneling effect, the electrical resistance of the cell change due to the orientation of the magnetic fields of the two layers. The electrical resistance is typically referred to as tunnel magnetoresistance (TMR) which is a magnetoresistive effect that occurs in a MTJ. The cell's resistance will be different for the parallel and anti-parallel states and thus the cell's resistance can be used to distinguish between a one and a zero. One important feature of MRAM devices is that they are non-volatile memory devices, since they maintain the information even when the power is off.

MRAM devices are considered as the next generation structures for a wide range of memory applications. MRAM products based on spin torque transfer switching are already making its way into large data storage devices. Spin transfer torque magnetic random access memory (STT-MRAM), or spin transfer switching, uses spin-aligned (polarized) electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a one or a zero based on whether the free layer is in the parallel or anti-parallel states relative to the reference layer.

FIG. 1 shows a conventional MRAM memory array architecture. Two adjacent memory cells 101 and 110 are shown. As shown in the memory cell 100, the MRAM cell has a bit line 102 and a source line 103 to write zeros and ones to an MTJ 104. As shown in cell 100, when the bit line 102 is high (e.g., Vdd) and a source line 103 is low (e.g., Vss) and a word line 106 is high, activating a gating transistor 105, current flows from the bit line 102 through the MTJ 104 to the source line 103, writing a zero in the MTJ 104. This is illustrated as the current 107. As shown in the memory cell 101, when the bit line 110 is low and the source line 111 is high and the word line 112 is high to activate the gating transistor 113, current flows from the source line 111 through the MTJ 114 (e.g., in the opposite direction) to the bit line 110, writing a one, as shown by the current 115.

FIG. 2 shows a conventional MRAM array 200. The array 200 shows columns of cells arranged between respective source lines 240-243 and bit lines 230-233. As fabrication process sizes get smaller and smaller, more and more cells are able to be fabricated within a given die area, effectively increasing the density of a memory array. Increasing density has the benefit of more memory per unit area and less power consumption. As the cell sizes get smaller, an overriding limitation becomes the pitch width of the parallel traces of the source lines 240-243 and the bit lines 230-233. As the array becomes more and more dense with increasingly smaller fabrication processes, a limitation emerges regarding the pitch width 250-252 (e.g., the amount of distance between parallel traces) of the array. This pitch width can approach a minimum. Below the minimum jeopardizes the proper functioning of the array. This minimum pitch width can effectively halt the increasing density of memory arrays even while using increasingly smaller fabrication processes.

Thus what is needed is a way to increase densities of an MRAM array without reducing pitch width below minimums. What is needed is a way to take advantage of advancing semiconductor fabrication techniques without impinging upon the minimum pitch width limits. What is needed is a way to increase MRAM array density and thereby increase performance and reduce costs while maintaining MRAM array reliability.

SUMMARY OF THE INVENTION

Embodiments of the present invention implement a perpendicular source and bit lines MRAM array where write bias voltage goes from high to low and a global source line is held at zero voltage, for instance. Embodiments of the present invention provide a way to increase densities of an MRAM array without reducing pitch width below minimums. Embodiments of the present invention provide a way to take advantage of advancing semiconductor fabrication techniques without impinging upon the minimum pitch width limits. Embodiments of the present invention provide a way to increase MRAM array density and thereby increase performance and reduce costs while maintaining MRAM array reliability.

In one embodiment, the present invention is implemented as a memory device comprising an array of memory cells wherein each memory cell includes a respective magnetic random access memory (MRAM) element, and a respective gating transistor. A plurality of bit lines are routed parallel to each other, wherein each bit line is associated with a respective memory cell of the array of memory cells. A common word line is coupled to gates of gating transistors of the array of memory cells. A common source line is coupled to sources of the gating transistors, wherein the common source line is routed perpendicular to the plurality of bit lines within the array of memory cells. A first circuit provides a first voltage on an addressed bit line of the plurality of bit lines during a write cycle, wherein the addressed bit line corresponds to an addressed memory cell. A second circuit provides a second voltage on remainder bits lines of the plurality of bit lines, wherein the second voltage is operable to be applied to the common source line, via the remainder bit lines, during the write cycle.

In one embodiment, said second voltage on said common source line is operable to be used in conjunction with said first voltage on said addressed bit line to store a data bit value into said addressed memory cell during said write cycle.

In one embodiment, a voltage polarity between said first and second voltages during said write cycle defines said data bit value. In one embodiment, each respective MRAM element of said memory array is coupled, at a first end thereof, to a respective bit line of said plurality of bit lines, and further coupled, at a second end thereof, to a drain of a respective gating transistor and wherein further said respective gating transistor comprises a gate coupled to said common word line and a source coupled to said common source line.

In one embodiment, during said write cycle, said common word line is operable to be active to cause said second voltage to be applied to said common source line through memory cells of said array of memory cells that are associated with said remainder bit lines.

In one embodiment, during said write cycle, said common word line is operable to be active to cause said second voltage to be applied to said common source line through memory cells of said array of memory cells that are associated with said remainder bit lines.

In one embodiment, during said write cycle, said common word line is operable to be active to cause said second voltage to be applied to said common source line through memory cells of said array of memory cells that are associated with said remainder bit lines.

In one embodiment, the present invention is implemented as a method of writing data to a memory device. The method includes activating a common word line, applying a first voltage to an addressed bit line of a plurality of bit lines, and applying a second voltage to remainder bit lines of the plurality of bit lines, wherein a data bit value is stored into an addressed memory cell associated with the addressed bit line during a write cycle. The memory device further includes an array of memory cells comprising the addressed memory cell, wherein each memory cell of the array of memory cells includes a respective magnetic random access memory (MRAM) element, and a respective gating transistor. The plurality of bit lines are routed parallel to each other, wherein each bit line is associated with a respective memory cell of the array of memory cells. The common word line is coupled to gates of gating transistors of the array of memory cells, and the common source line coupled to sources of the gating transistors, wherein the common source line is routed perpendicular to the plurality of bit lines within the array of memory cells.

In one embodiment, the present invention is implemented as a method for programming a memory device comprising selecting a bit line of a memory cell of an array and driving a word line coupled to a gate of a gating transistor to activate the memory cell, wherein unselected are grounded to a desired voltage, causing the desired voltage to bleed onto a common virtual source line of the cell. The selected bit line and the common source line are disposed perpendicularly to one another. The selected bit line is driven to a voltage higher than the desired voltage to program a first data value into the memory cell. The selected bit line is driven to a voltage lower than the desired voltage to program a second data value into the memory cell.

In this manner, embodiments of the present invention implement a MRAM array where each cell contains a perpendicular bit line to source line. The source line is held to zero volts and applied across the array in a global fashion. The write bias voltage goes from +VBL to −VBL for writing data. The word line addresses the cell in combination with the bit line. Typically, the word line addresses all the cells of a row in the array. Perpendicular bit line to source line disposition allows for a tighter pitch from cell to cell by elimination of the prior art dual parallel bit line and source line approach that was required for each cell. These embodiments provide a way to increase densities of an MRAM array without reducing pitch width below minimums, and provide a way to take advantage of advancing semiconductor fabrication techniques without impinging upon the minimum pitch width limits.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Perpendicular Source and Bit Lines for an MRAM Array

Embodiments of the present invention implement a MRAM array where each cell contains a perpendicular bit line to source line. The source line is held to zero volts and may be applied across the array in a global fashion. The write bias voltage goes from +VBL to −VBL for writing data. In one embodiment, the word line and the bit line address the cell. Perpendicular bit line to source line allows for a tighter pitch from cell to cell by elimination of the prior art dual parallel bit line and source line approach that was required for each cell. In another embodiment, the source line is biased not at zero but at some mid level voltage between 0V and VBL (e.g., Vmid), bit line bias would then be between VBL and a higher voltage (e.g., VBL+Vmid). These embodiments provide a way to increase densities of an MRAM array without reducing pitch width below minimums, and provide a way to take advantage of advancing semiconductor fabrication techniques without impinging upon the minimum pitch width limits.

Figure 3:
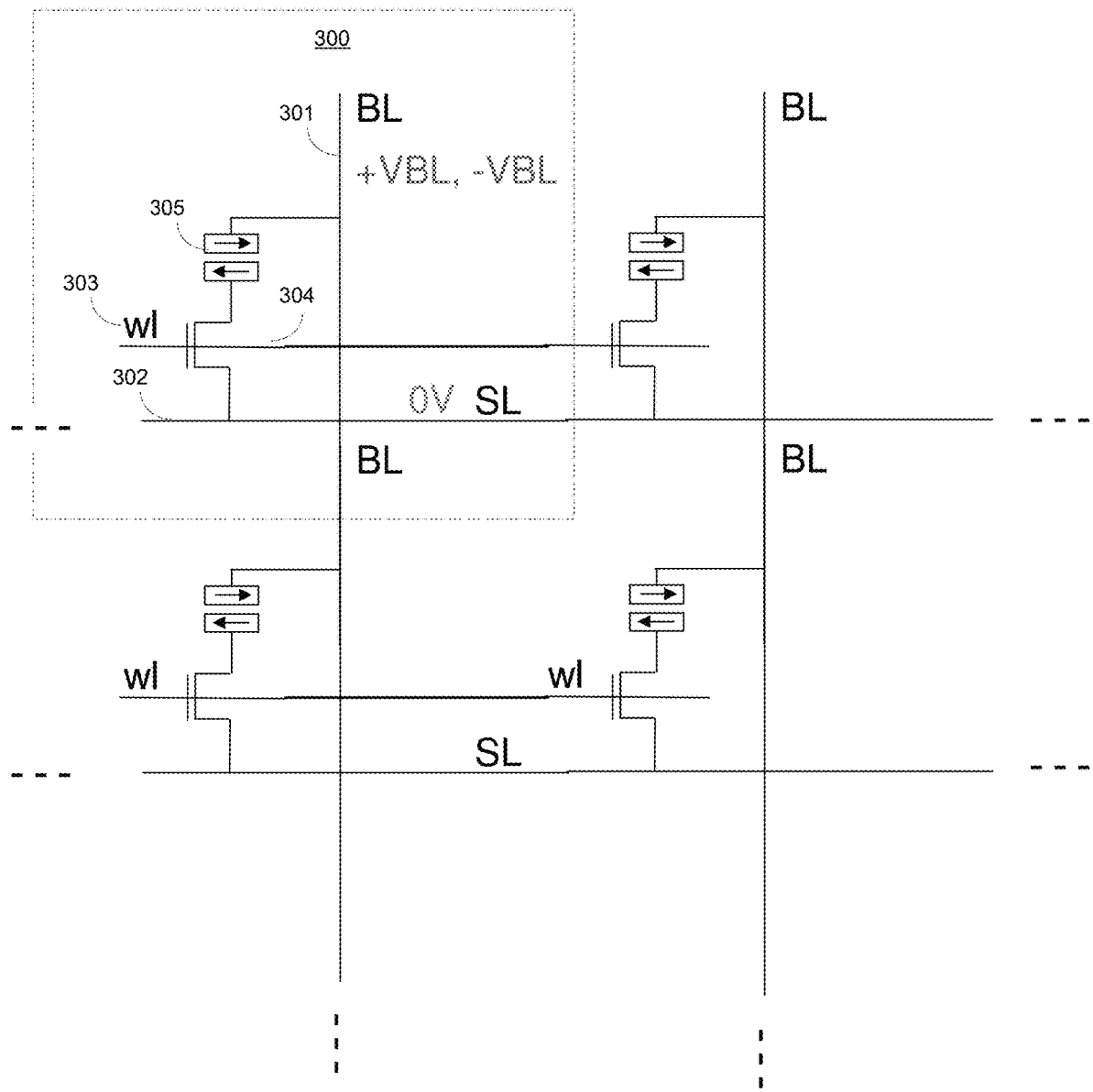
FIG. 3 shows a perpendicular memory cell in accordance with one embodiment of the present invention.

FIG. 3 shows a perpendicular memory cell 300 in accordance with a first embodiment of the present invention. As shown in FIG. 3, a bit line 301 is fabricated perpendicular to a source line 302. The bit line 301 is coupled to an MTJ 305. The source line 302 is coupled to the MTJ 305 via a gating transistor 304. The gating transistor 304 is activated and deactivated by the word line 303.

Figure 1:
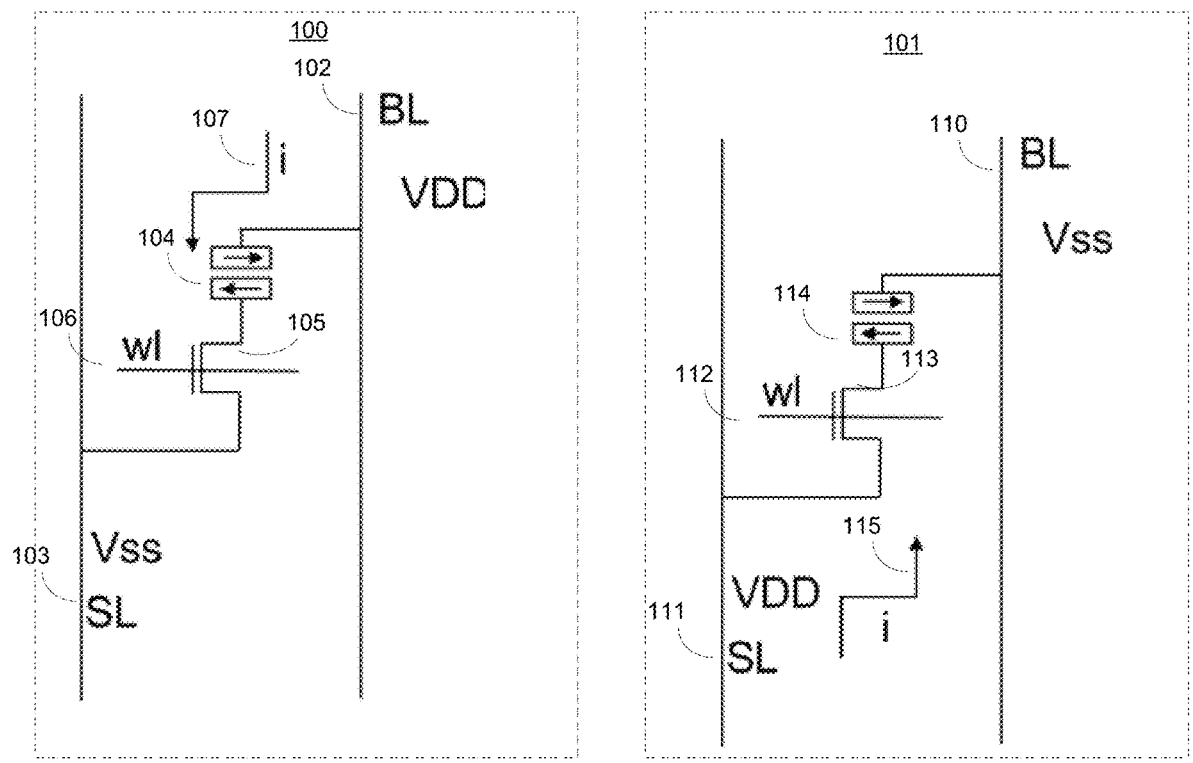
FIG. 1 shows a conventional MRAM architecture in accordance with the prior art.
Figure 2:
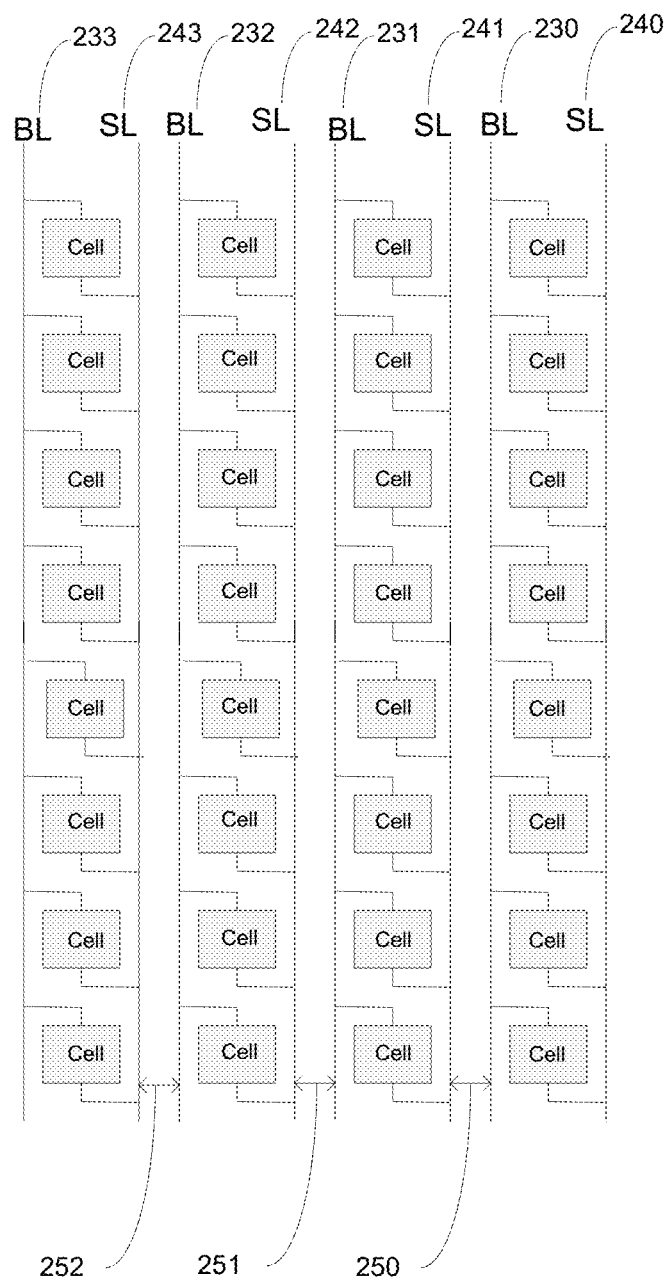
FIG. 2 shows a conventional MRAM array in accordance with the prior art.

The perpendicular bit line to source line arrangement provides for a smaller cell area requirement. This allows for a tighter pitch from cell to cell by elimination of the conventional dual trace line approach (e.g., shown in FIG. 2) that was required for each cell. This can be seen from the arrangement of cell 300 with the exemplary adjacent cells to the right and below. This architecture avoids the trace line minimum pitch width problems of the conventional dual parallel bit line source line architecture.

As shown in FIG. 3 embodiment, driving the bit line 301 positive (e.g., +VBL) or the bit line 301 negative (e.g., −VBL) while globally sharing the source line 302 at ground (e.g., 0V) can operate the perpendicular memory cell 300. With the word line 303 high, the gating transistor 304 will be active and current will flow through the MTJ 305 from the bit line 301 through the MTJ 305 to the source line 302, writing a zero. Conversely, with the bit line −VBL, the source line 302 at ground, and the word line 305 high, the gating transistor 304 will be active and current will flow through the MTJ 305 from the source line 302 to the bit line 301, writing a one. The remaining bit lines of the array can be allowed to float.

It should be noted that non-selected word lines may need to be biased to the bit line negative voltage (e.g., −VBL). In conventional implementations, non-selected word lines are at zero volts. But with the bit lines at −VBL, the gate to drain voltage on the non-selected word lines is at a positive voltage. If non-selected word lines are not biased to −VBL, when the bit line goes −VBL, all the non-selected word line transistors connected to the bit line via memory cells will activate and allow current to flow from the source line through the cells to the bit line. This effectively writes ones to the cells of those non-selected word lines.

It should be noted that in one embodiment, the non-selected word lines do not need to be biased all the way to −VBL. For example, in one embodiment, non-selected word lines are biased to one half −VBL, which reduces the gate to drain voltage enough to ensure the non-selected word line gating transistors are not turned on.

It should be noted that in one embodiment, there can be an additional problem with memory cell 300. If the word line 303 is high and the gating transistor 304 transistor is turned on, it's gate is at Vdd. If −VBL is on the bit line 301, there ends up being a very large difference in voltage between the gating transistor 304 gate (e.g., +1 volt) and VBL (e.g., −1 volt), which comprises a 2 volt delta. That drives a very large current through the transistor 304, resulting in the transistor 304 being over driven. The effects of the over driving become more apparent over time with the transistor 304 becoming weaker and weaker with diminished drive current before the transistor 304 eventually breaks.

In one embodiment, this over driven condition is compensated for by driving the bit line 301 to −½ VBL, reducing the current flowing through the gating transistor 304 to an amount sufficient to write the MTJ 305, and an amount that puts less stress on the transistor 304. It should be noted that this approach reduces the stress but does not eliminate the stress altogether. In one embodiment, the gating transistors are size adjusted for the case where there is positive Vdd on the bit line and positive Vdd on the word line. Additionally, by reducing the magnitude of the −VBL, the negative bias needed for the non-selected word lines is correspondingly reduced.

Figure 4:
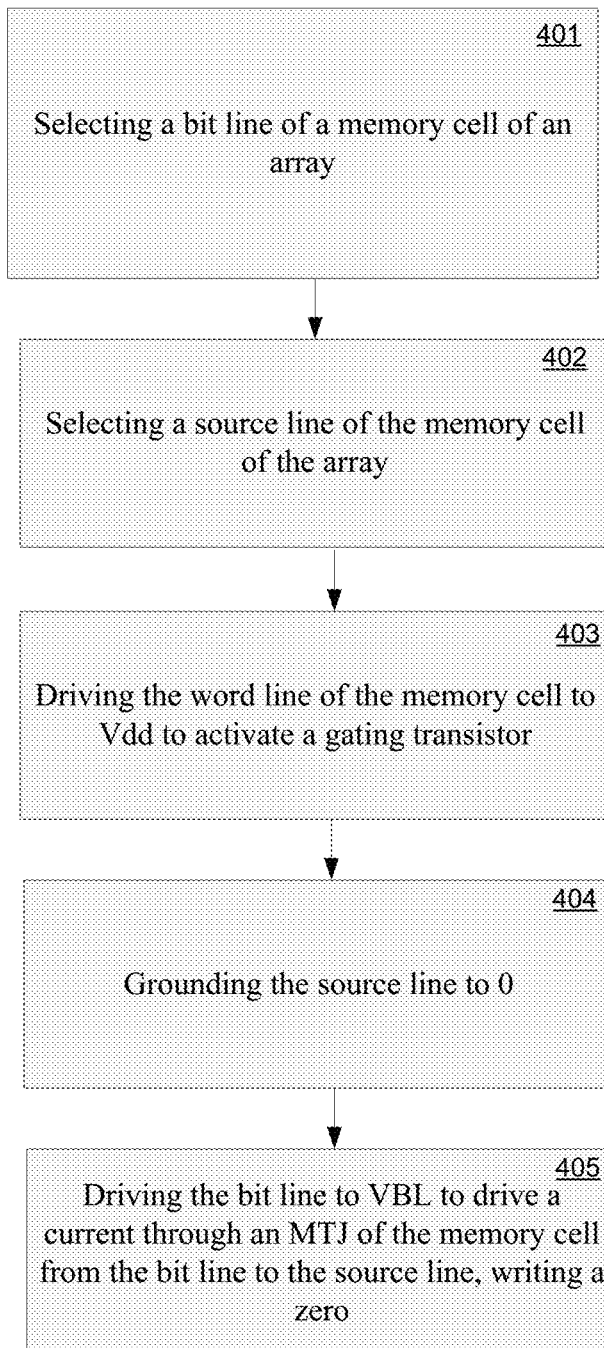
FIG. 4 shows a flow chart of the steps of a process of writing a logical zero into the memory cell for embodiment one.

FIG. 4 shows a flow chart of the steps of a process 400 of writing a logical zero into the memory cell 300. Process 400 begins in step 401, where the bit line of the memory cell (e.g., memory cell 300) is selected. In step 402, the source line of the memory cell is selected while the remainder bit lines are allowed to float. In step 403, the word line of memory cell is driven to Vdd to activate the gating transistor. In step 404, the source line is grounded to zero. And in step

405, the bit line is driven to VBL to drive a current through the MTJ of the memory cell from the bit line to the source line, writing a logical zero.

Figure 5:
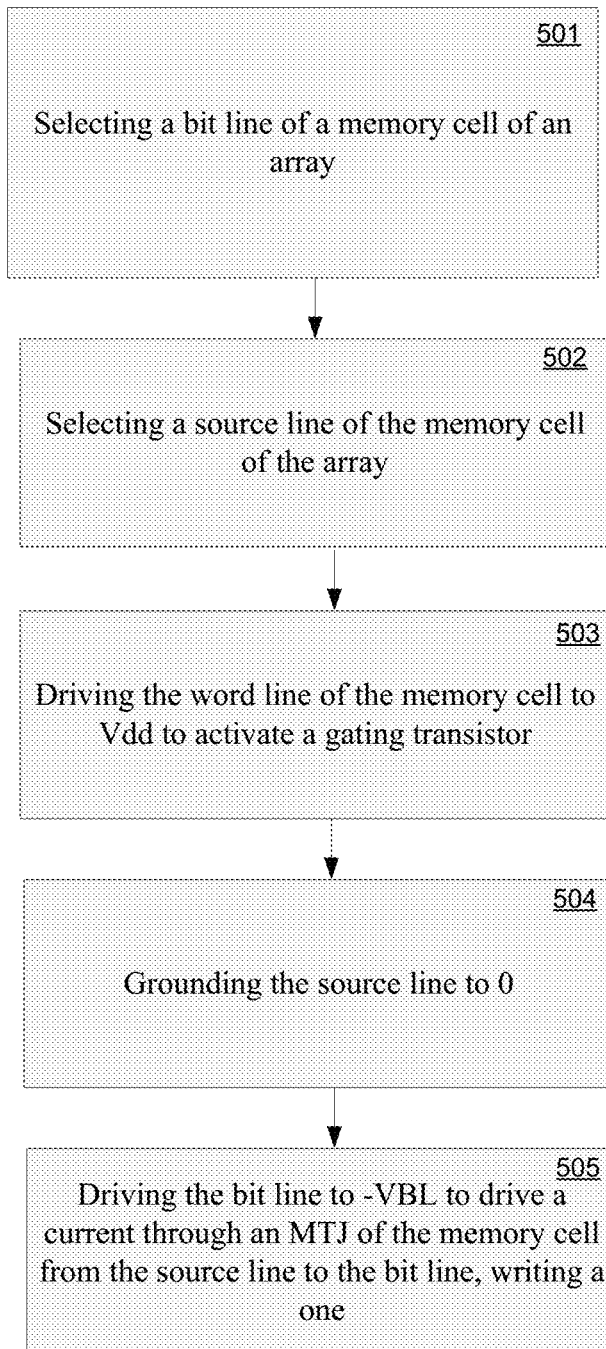
FIG. 5 shows a flow chart of the steps of a process of writing a logical one into the memory cell for the first embodiment of the present invention.

FIG. 5 shows a flow chart of the steps of a process 500 of writing a logical one into the memory cell 300. Process 500 begins in step 501, where the bit line of the memory cell (e.g., memory cell 300) is selected, while the remainder of the bit lines are allowed to float. In step 502, the source line of the memory cell is selected. In step 503, the word line of memory cell is driven to Vdd to activate the gating transistor. In step 504, the source line is grounded to zero. And in step 505, the bit line is driven to −VBL to drive a current through the MTJ of the memory cell from the source line to the bit line, writing a logical one.

Figure 6:
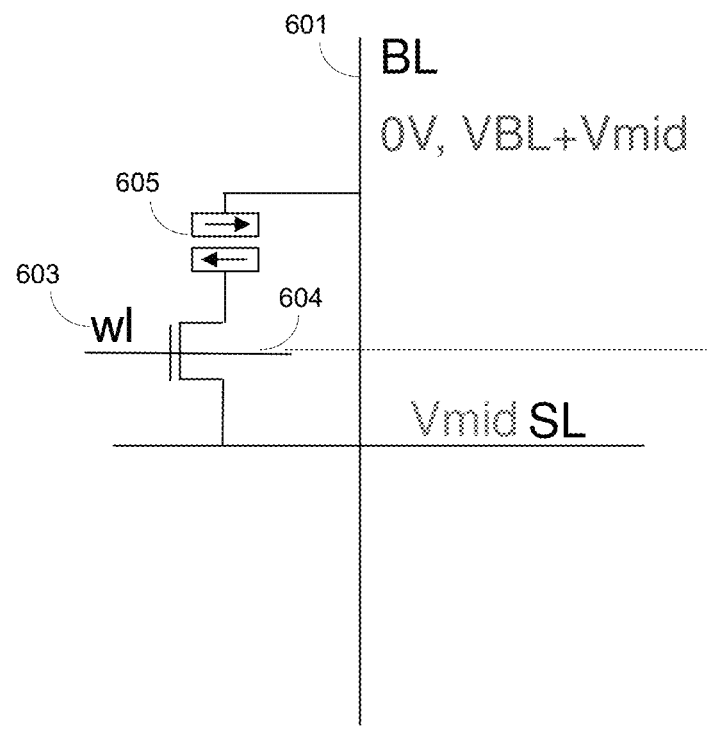
FIG. 6 shows a perpendicular memory cell in accordance with a second embodiment of the present invention.

FIG. 6 shows a perpendicular memory cell 600 in accordance with one embodiment of the present invention. As shown in FIG. 6, a bit line 601 is fabricated perpendicular to a source line 602. The bit line 601 is coupled to an MTJ 605. The source line 602 is coupled to the MTJ 605 via a gating transistor 604. The gating transistor 604 is activated and deactivated by the word line 603.

The FIG. 6 second embodiment shows the bit line 601 can be driven to have a voltage at zero, and a voltage at some point between 0 and VBL, referred to in FIG. 6 as VBLmid. In this approach the source line is biased to VBLmid and the bit line alternates between 0 and VBL plus the VBLmid voltage (e.g., VBL+VBLmid to write different data values). In this implementation, 0 voltage on the bit line with VBLmid on the source line writes a logical one into the cell when the gating transistor 604 is activated. Correspondingly, VBL+VBLmid on the bit line with VBLmid on the source line writes a logical zero into the cell when the gating transistor is activated. This would reduce some of the stress on the gating transistor 604 by lessening the voltage differential between the gate and the drain.

Figure 7:
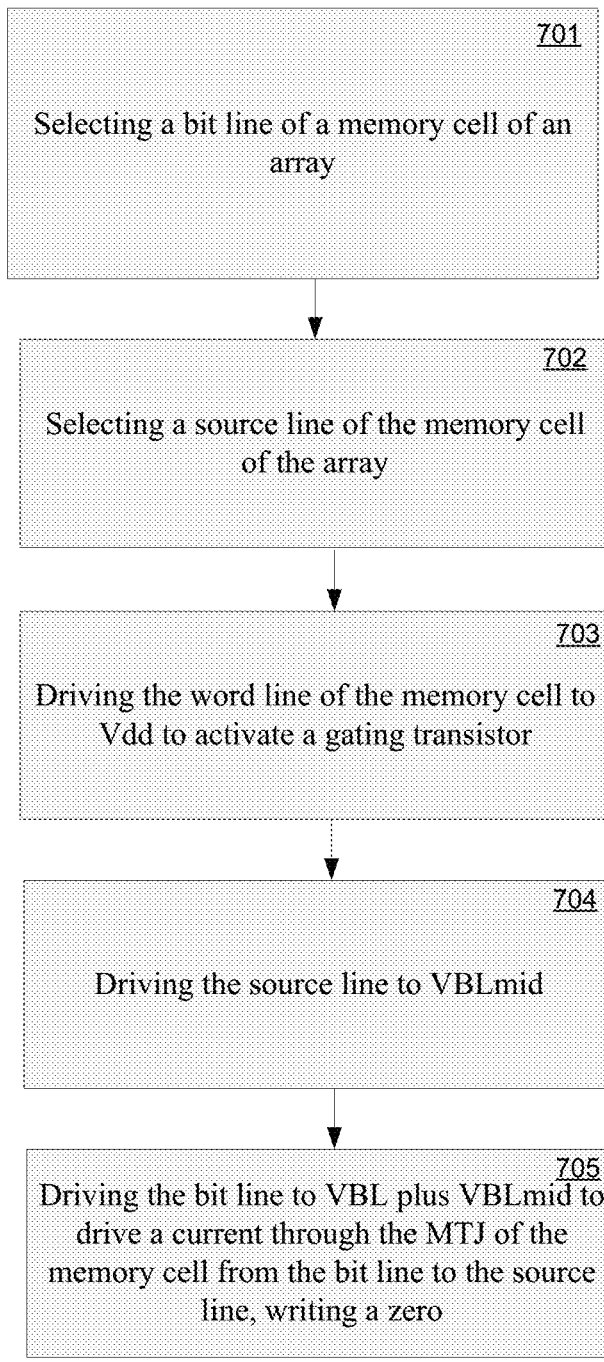
FIG. 7 shows a flow chart of the steps of a process of writing a logical zero into the memory cell for the second embodiment.

FIG. 7 shows a flow chart of the steps of a process 700 of writing a logical zero into the memory cell 600. Process 700 begins in step 701, where the bit line of the memory cell (e.g., memory cell 600) is selected while the remainder of the bit lines are allowed to float. In step 702, the source line of the memory cell is selected. In step 703, the word line of memory cell is driven to Vdd to activate the gating transistor. In step 704, the source line is driven to VBLmid. And in step 705, the bit line is driven to VBL plus VBLmid to drive a current through the MTJ of the memory cell from the bit line to the source line, writing a logical zero.

Figure 8:
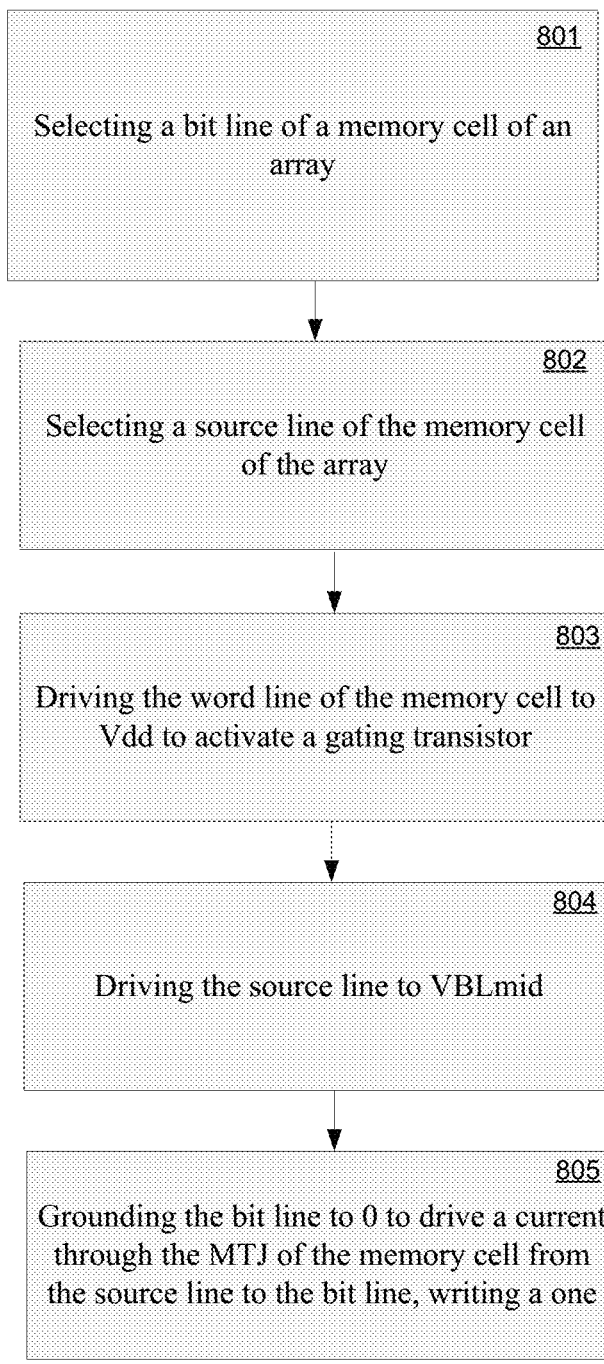
FIG. 8 shows a flow chart of the steps of a process of writing a logical one into the memory cell for the second embodiment.

FIG. 8 shows a flow chart of the steps of a process 800 of writing a one into the memory cell 600. Process 800 begins in step 801, where the bit line of the memory cell (e.g., memory cell 600) is selected. In step 802, the source line of the memory cell is selected. In step 803, the word line of memory cell is driven to Vdd to activate the gating transistor. In step 804, the source line is driven to VBLmid. And in step 805, the bit line is grounded to 0 to drive a current through the MTJ of the memory cell from the source line to the bit line, writing a one.

Memory Array with Horizontal Source Line and a Virtual Source Line

Embodiments of the present invention implement an MRAM array where each cell contains a perpendicular bit line to source line (e.g., horizontal source line). The source line is grouped over a number of cells and is a "virtual source line" in that it receives its voltage from all the cells of the group that are not being addressed. The word line for all cells of the group are turned on, e.g., common word line. In this third embodiment, unselected bit lines on same word line are used to advantageously bias the source line. For instance, in a first case for the cell being addressed, the bit line is driven to VBL for writing data a first data bit and the remainder of the cells of the group receive 0V on their bit lines (e.g., which "bleeds" to the source line). In a second case for the cell being addressed, the bit line is driven to 0V line for writing a second data bit and the remainder of the cells of the group receive VBL on their bit lines (e.g., which "bleeds" to the source line).

Figure 9:
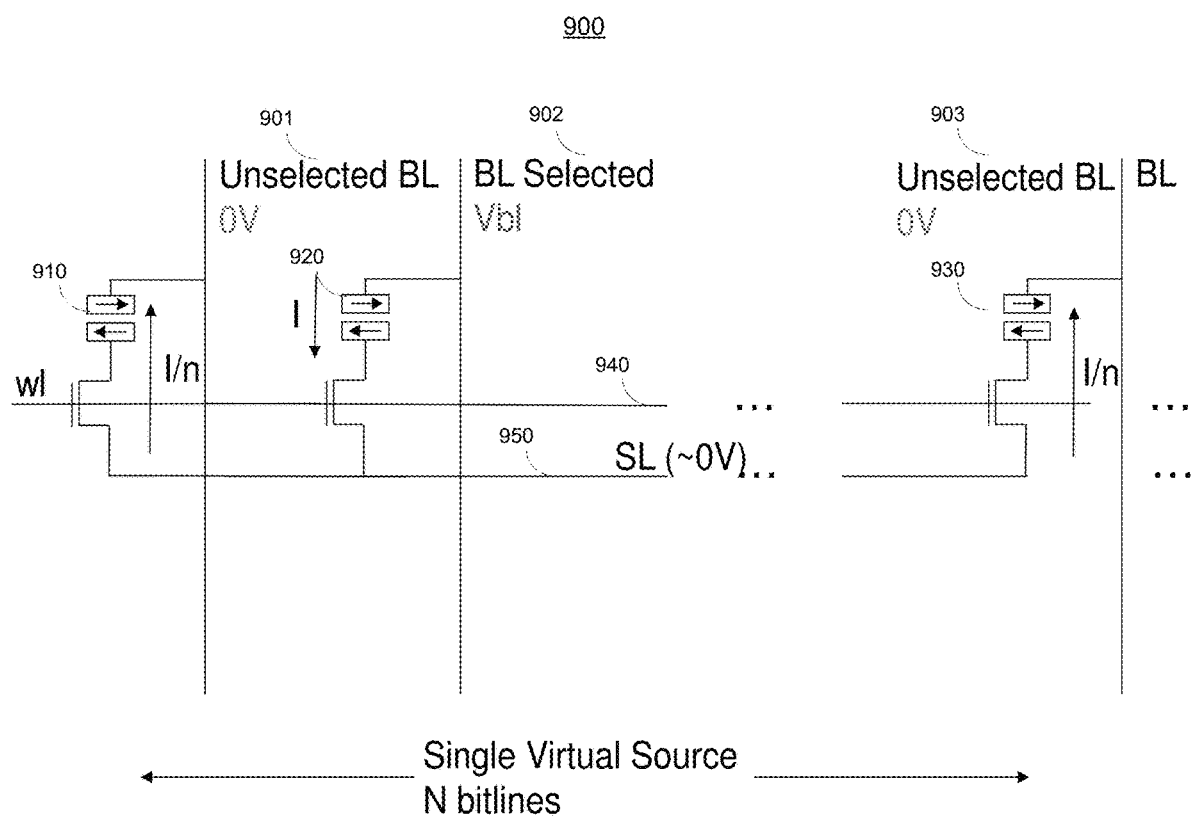
FIG. 9 shows a row comprising a plurality of memory cells having a common single virtual source line in accordance with one embodiment of the present invention.

FIG. 9 shows a row 900 comprising a plurality of memory cells having a common single virtual source line in accordance with the third embodiment of the present invention. FIG. 9 shows bit lines 901-903, where bit lines 901 and 903 are unselected bit lines, and bit line 902 is a selected bit line.

In the FIG. 9 embodiment, an MRAM array is implemented where each cell contains a perpendicular bit line to source line (e.g., horizontal virtual source line). The source line (e.g., source line 950) is grouped over a number of cells and is a "virtual source line" in that it receives its voltage from the bit lines of all the cells of a group that are not being addressed. A typical group could comprise 32 bits or 64 bits. The word lines for all cells of the group are turned on, e.g., as a common word line 940. Unselected bit lines (e.g., 901 and 903) on same word line 940 are used to bias the virtual source line 950 through their associated memory cells.

In one embodiment, the word line 940 is active across the entire row. All the transistors on the row are activated. For instance, for the cell being addressed, the cell receives VBL on its bit line (e.g., 902) for writing data to MTJ 920 and the remainder of the cells of the group are grounded to receive 0V on their bit lines (e.g., 901 and 903), which "bleeds" to the source line 950. This VBL on bit line 902 causes a current to flow through the cell from the bit line 902 to the common virtual source line 950, thus writing a logical zero in the cell. The current from the unselected memory cells bleeds out onto the virtual source line 950. In the FIG. 9 embodiment, there are a large enough number of cells coupled to the virtual source line to ensure the VBL current from bit line 902 does not disturb any neighboring cells (e.g., MTJ 910 and MTJ 930).

Figure 10:
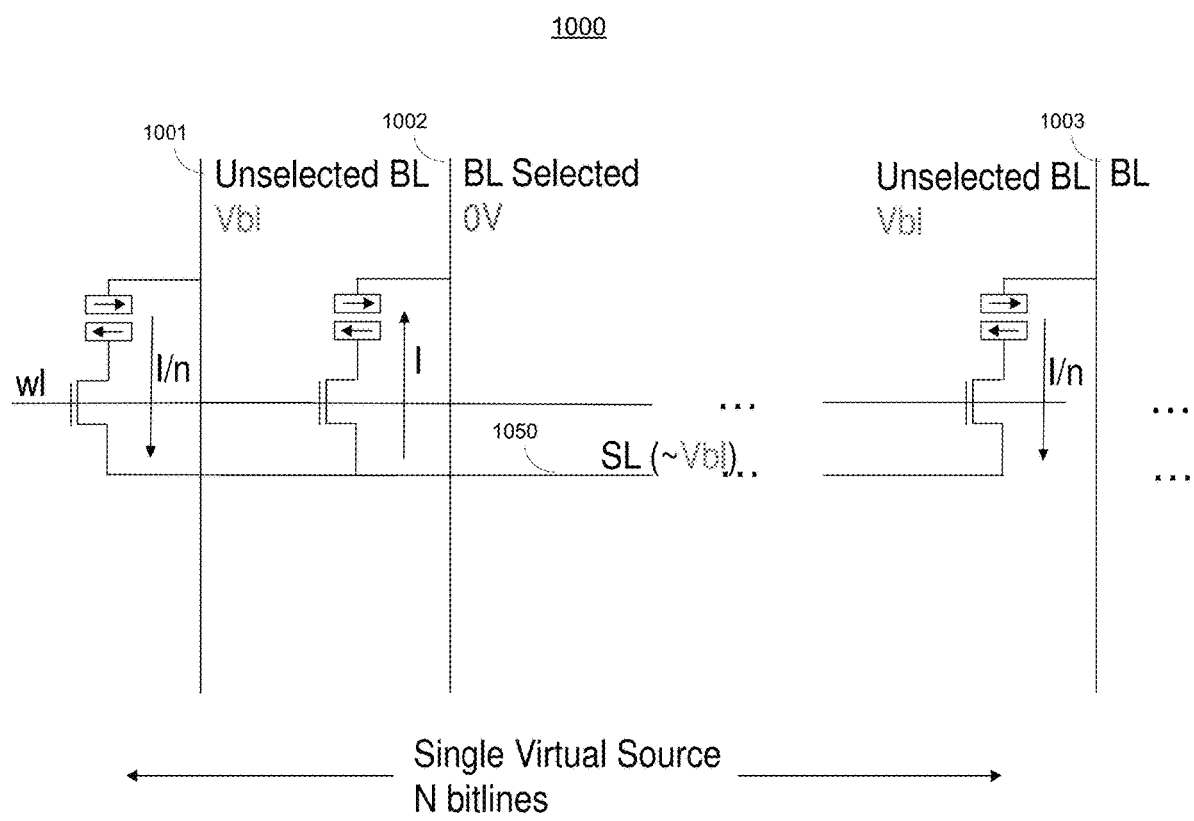
FIG. 10 shows a row comprising a plurality of memory cells having a common single virtual source line in accordance with a third embodiment of the present invention.

FIG. 10 shows a row 1000 comprising a plurality of memory cells having a common single virtual source line in accordance with the third embodiment of the present invention. The FIG. 10 embodiment shows writing a one into the selected cell. As with FIG. 9, an MRAM array is implemented where each cell contains a perpendicular bit line to source line (e.g., horizontal virtual source line 1050). In order to write a one into the cell, 0V is placed on the selected bit line 1002 and VBL is driven onto the unselected bit lines (e.g., bit lines 1001 and 1003) which bleeds to the virtual source line 1050 through the unselected memory cells. This causes a current to flow through the cell from the virtual source line 1050 to the selected bit line 1002, writing a logical one.

Figure 11:
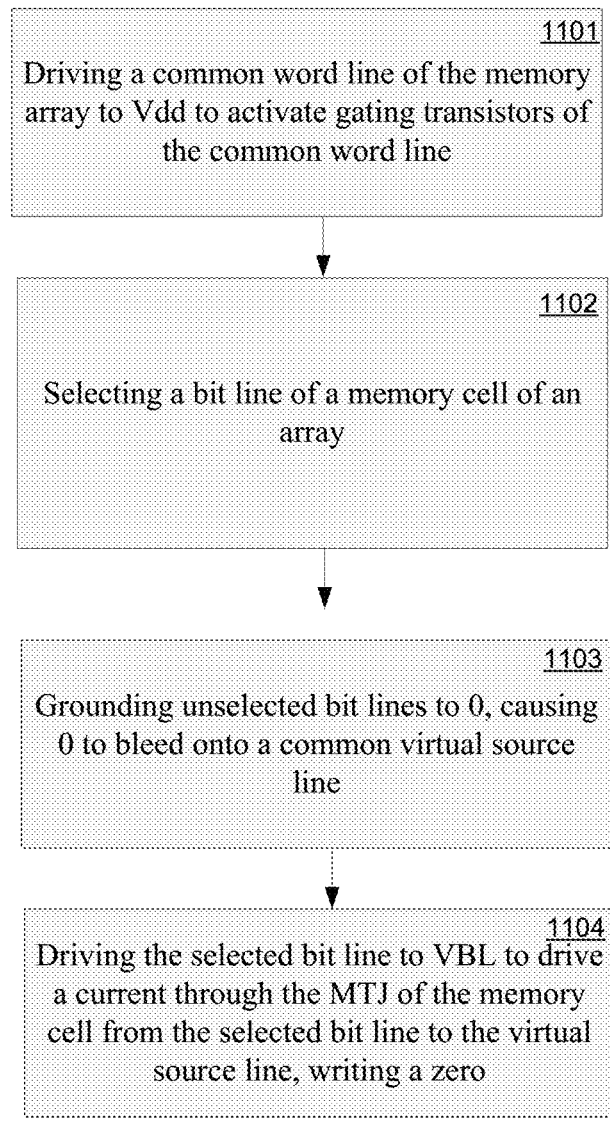
FIG. 11 shows a flow chart of the steps of a process of writing a logical zero into the memory cell for the third embodiment.

FIG. 11 shows a flow chart of the steps of a process 1100 of writing a logical zero into the memory cell 900 of the third embodiment. Process 1100 begins in step 1101, where a common word line (e.g., word line 1040) of the memory array is driven to Vdd to activate gating transistors of the common word line. In step 1102, a bit line of the memory cell (e.g., bit line 1002) is selected. In step 1103, unselected bit lines are grounded to zero, causing 0 to bleed onto the common virtual source line as discussed above. In step 1104, the selected bit line 1002 is driven to VBL to drive a current through the MTJ of the memory cell from the selected bit line to the virtual source line, writing a logical zero.

Figure 12:
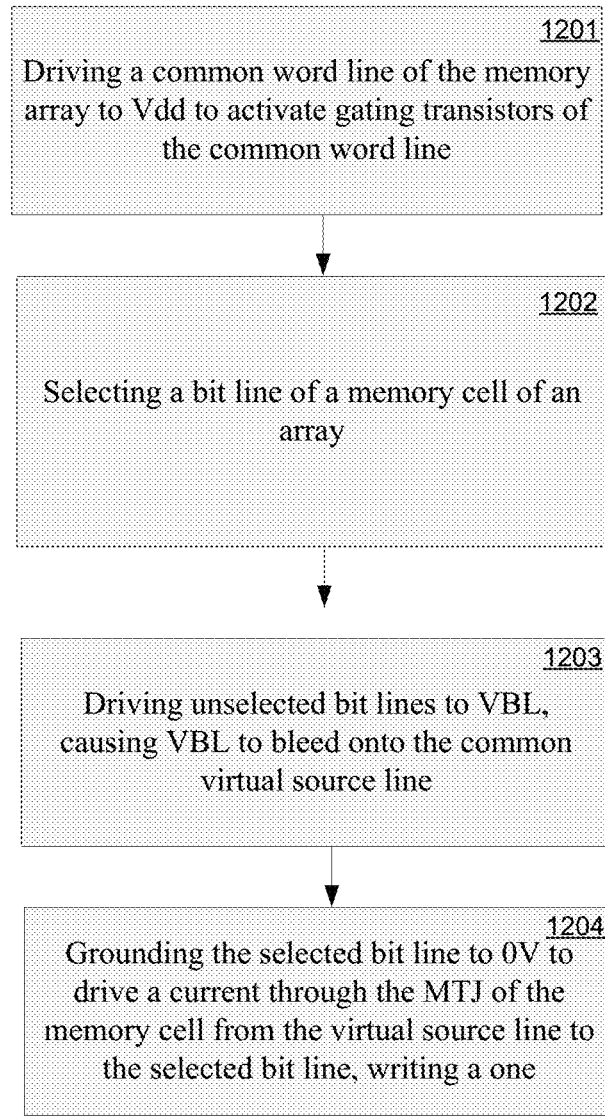
FIG. 12 shows a flow chart of the steps of a process of writing a logical one into the memory cell for the third embodiment.

FIG. 12 shows a flow chart of the steps of a process 1200 of writing a one into the memory cell 1000 of the third embodiment. Process 1200 begins in step 1201, where a common word line (e.g., word line 1040) of the memory array is driven to Vdd to activate gating transistors of the common word line. In step 1202, a bit line of the memory cell (e.g., bit line 1002) is selected. In step 1103, unselected bit lines are driven to VBL, causing VBL to bleed onto the common virtual source line as discussed above. In step 1204, the selected bit line is grounded to drive a current through the MTJ of the memory cell from the virtual source line to the selected bit line, writing a logical one.

A Memory Array with Horizontal Source Line and Sacrificial Bitline Per Virtual Source Embodiments of the present invention implement an MRAM array where each cell contains a perpendicular bit line to source line (e.g., horizontal source line). The source line is grouped over a number of cells and is a "virtual source line" in that it receives its voltage from a sacrificial cell. Embodiments of the present invention use a sacrificial bit line to bias the source line. For example, for the cell being addressed, that cell receives VBL for writing a first data bit (e.g., a zero) and the sacrificial cell of the common group receives 0V on its bit line (e.g., which has no memory element and directly feeds the source line). In the opposite data value case, for the cell being addressed, it receives 0V on the bit line for writing data a second data bit (e.g., a one) and the sacrificial cell of the group receives VBL on its bit line (e.g., which directly feeds to the source line). The cell can be "sacrificial" by shorting out the cell's MTJ, or by use of a fabricated via element, or by use of a fabricated direct line, etc. A number of methods are possible for shorting out the sacrificial cell. For example, in one embodiment, during post fabrication testing, bad cells can be identified and shorted out for this purpose.

Figure 13:
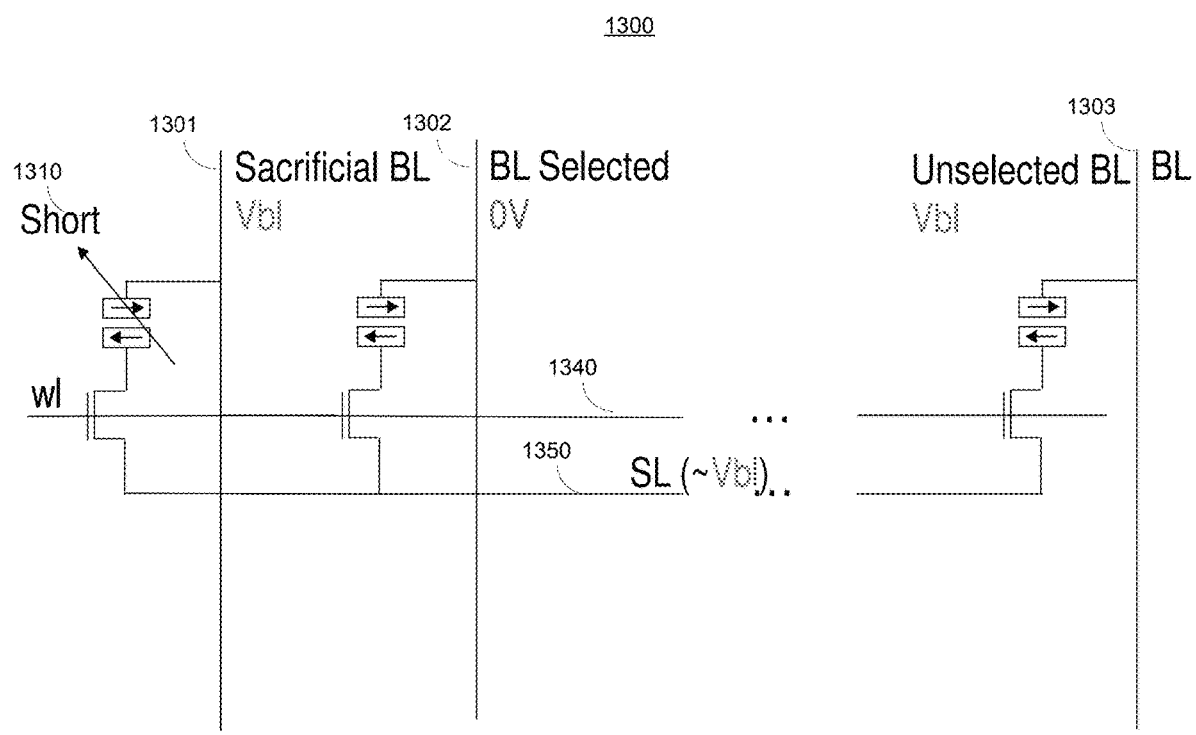
FIG. 13 shows a row comprising a plurality of memory cells having a common single virtual source line in accordance with a fourth embodiment of the present invention.

FIG. 13 shows a row 1300 comprising a plurality of memory cells having a common single virtual source line 1350 in accordance with this fourth embodiment of the present invention. FIG. 9 shows bit lines 1301-1303, where bit lines 1301 and 1303 are unselected bit lines, and bit line 1302 is a selected bit line.

In the FIG. 13 embodiment, an MRAM array is implemented where each cell contains a perpendicular bit line to source line architecture (e.g., horizontal virtual source line 1350). The source line 1350 is grouped over a number of cells and is a "virtual source line" in that it receives its voltage from all the cells of a group that are not being addressed. Additionally, FIG. 13 shows a sacrificial bit line 1301. Sacrificial bit line 1301 is connected to a "shorted out" MTJ 1310. This shorted MTJ 1310 provides a more direct path for current having low resistance from the sacrificial bit line 1301 to flow to or from the common virtual source line 1350. In one embodiment, MTJ 1310 is shorted out during post fabrication testing (e.g., by intentionally over driving the transistor). A number of methods are possible for shorting out the sacrificial cell. For example, in one embodiment, during post fabrication testing, bad cells can be identified and shorted out for this purpose. It should be noted that a sacrificial bit line can be implemented without using a virtual bit line. In one embodiment, multiple sacrificial bit lines can be implemented.

The word line for all cells of the group is turned on, e.g., as a common word line 1340. As described above, a typical group could comprise 32 bits, 64 bits. Unselected bit lines (e.g., 1301 and 1303) on same word line 1340 may be used to bias the virtual source line 1350, in conjunction with the sacrificial bit line, with the sacrificial bit line 1301 having a lower resistance connection through the shorted MTJ 1310. In one embodiment, the word line 1340 is active across the entire row. All the transistors on the row are activated. For instance, for the cell being addressed, the cell receives VBL on its bit line (e.g., 1302) for writing data and the remainder of the cells of the group may be grounded to receive 0V on their bit lines (e.g., 1301 and 1303), which "bleeds" to the source line 1350. This bleeding occurs quickly with respect to the sacrificial cell since the sacrificial bit line has a low resistance pathway provided by the shorted MTJ 1310. This VBL on bit line 1302 causes a current to flow through the cell, thus writing a logical zero in the cell. The current bleeds out onto the virtual source line 1350.

In order to write a logical one into the cell, 0V is placed on the selected bit line 1302 and VBL is driven onto the unselected bit lines (e.g., bit lines 1301 and 1303) which bleeds to the virtual source line 1350. This causes a current to flow through the cell from the virtual source line 1350 to the selected bit line 1302, writing a one.

Figure 14:
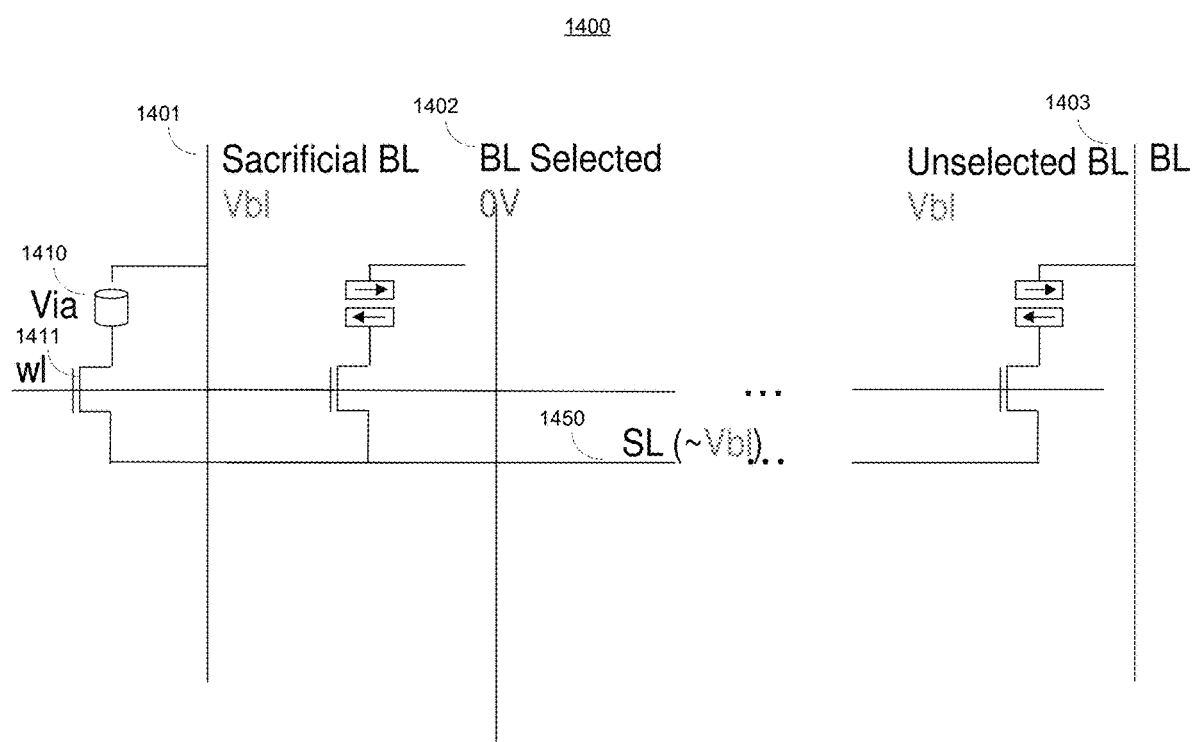
FIG. 14 shows a row comprising a plurality of memory cells having a common single virtual source line in accordance with a fourth embodiment of the present invention.

FIG. 14 shows a row 1400 comprising a plurality of memory cells having a common single virtual source line in accordance with one embodiment of the present invention. Row 1400 of FIG. 14 is substantially similar to row 1300 of FIG. 13. However, the FIG. 14 embodiment shows a via element 1410 connecting sacrificial bit line 1401 to the gating transistor 1411 and to the common virtual source line 1450. In this embodiment, the via element 1410 provides an even lower resistance pathway between the sacrificial bit line 1401 and the common virtual source line 1450 as compared to the shorted MTJ 1310. The via element is produced during die fabrication. In other aspects, the row performs the same.

Figure 15:
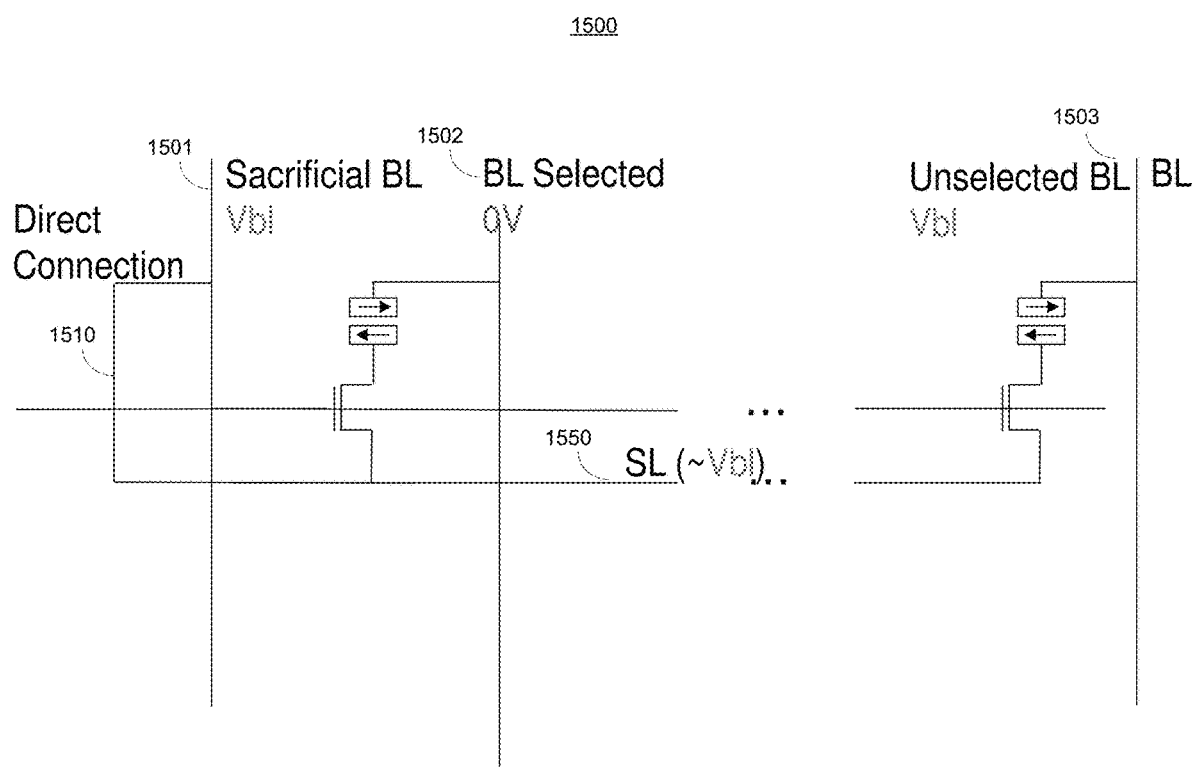
FIG. 15 shows a row comprising a plurality of memory cells having a common single virtual source line in accordance with a fourth embodiment of the present invention.

FIG. 15 shows a row 1500 comprising a plurality of memory cells having a common single virtual source line in accordance with one embodiment of the present invention. Row 1500 of FIG. 15 is substantially similar to row 1400 of FIG. 14. However, the FIG. 15 embodiment shows a direct connection 1510 connecting sacrificial bit line 1501 to the common virtual source line 1550. In this embodiment, the strait through connection directly (e.g., without an intervening gating transistor) provides an even lower resistance pathway between the sacrificial bit line 1501 and the common virtual source line 1550 as compared to the shorted MTJ 1310 or the via element 1410. The direct connection is produced during die fabrication. In other aspects, the row performs the same.

Figure 16:
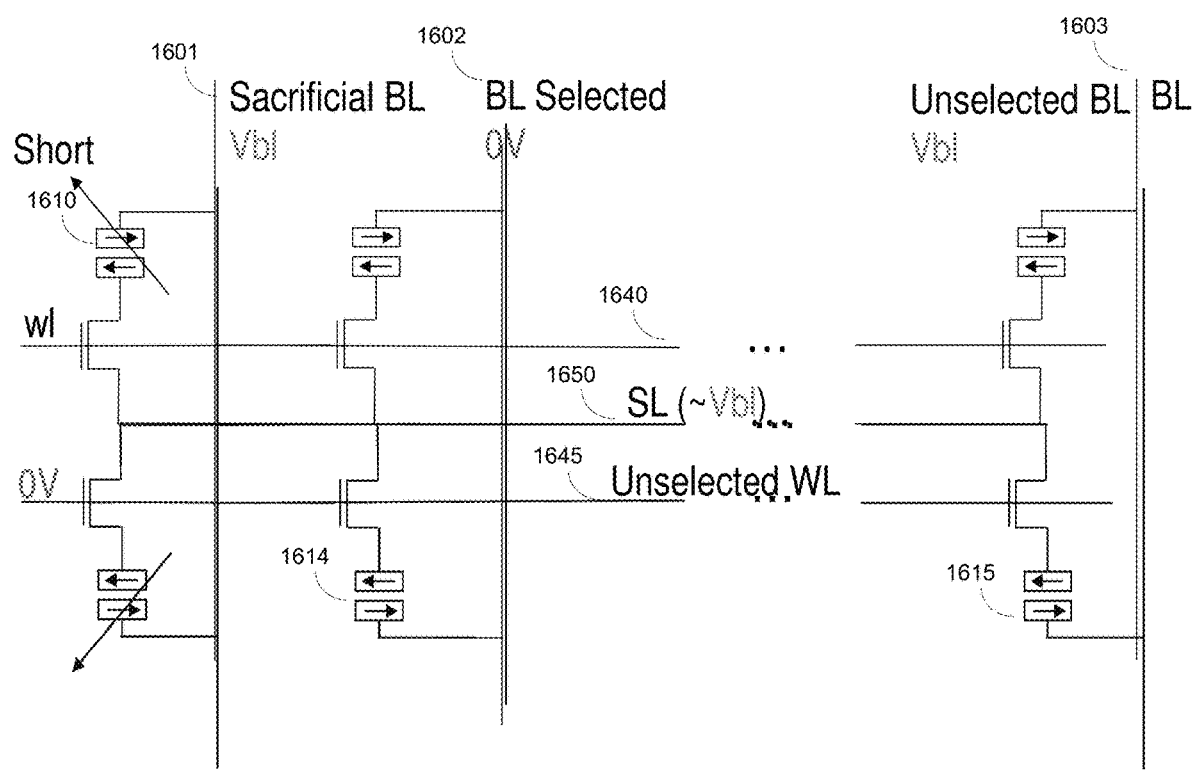
FIG. 16 shows two rows of three cells each in accordance with a fourth embodiment of the present invention.

FIG. 16 shows two rows of three cells each in accordance with one embodiment of the present invention. In the FIG. 16 embodiment, an MRAM array is implemented where each cell contains a perpendicular bit line to source line (e.g., horizontal virtual source line 1650). The source line 1650 is grouped over a number of cells and is a "virtual source line" in that it may receive its voltage from all the cells of a group that are not being addressed. As shown in FIG. 16, the virtual source line 1650 is able to receive voltage from both the upper row of cells and the lower row of cells, depending upon which word line is active. The upper row of cells is connected to the common word line 1640 and the lower row of cells is connected to the common word line 1645.

Additionally, FIG. 16 shows a sacrificial bit line 1601. Sacrificial bit line 1601 is connected to a "shorted out" MTJ 1610. This shorted MTJ 1610 provides a lower resistance path for current from the sacrificial bit line 1601 to flow to or from the common virtual source line 1650.

The word line for all cells of the upper row is turned on, e.g., as a common word line 1640. The common word line 1645 for the lower row of cells is unselected and turned off. This isolates the MTJs 1614-1615 from the common virtual source line 1650.

Unselected bit lines (e.g., 1601 and 1603) on same word line 1640 are used to bias the virtual source line 1650, with the sacrificial bit line 1601 having a lower resistance connection through the shorted MTJ 1610. In one embodiment, the word line 1640 is active across the entire row. All the transistors on the row are activated. For instance, for the cell being addressed, the cell receives 0 volts on its bit line (e.g., 1602) for writing data and the remainder of the cells of the group are driven to receive VBL on their bit lines (e.g., 1601 and 1603), which "bleeds" to the source line 1650. This bleeding occurs quickly since the sacrificial bit line has a low resistance pathway provided by the shorted MTJ 1610. The VBL on common virtual source line 1650 causes a current to flow through the cell to the selected bit line, thus writing a one in the cell.

In order to write a zero into the cell, VBL is placed on the selected bit line 1602 and the unselected bit lines (e.g., bit lines 1601 and 1603) are grounded which bleeds to the virtual source line 1650. This causes a current to flow through the cell from the selected bit line 1602, to the virtual source line 1650 writing a zero.

Figure 17:
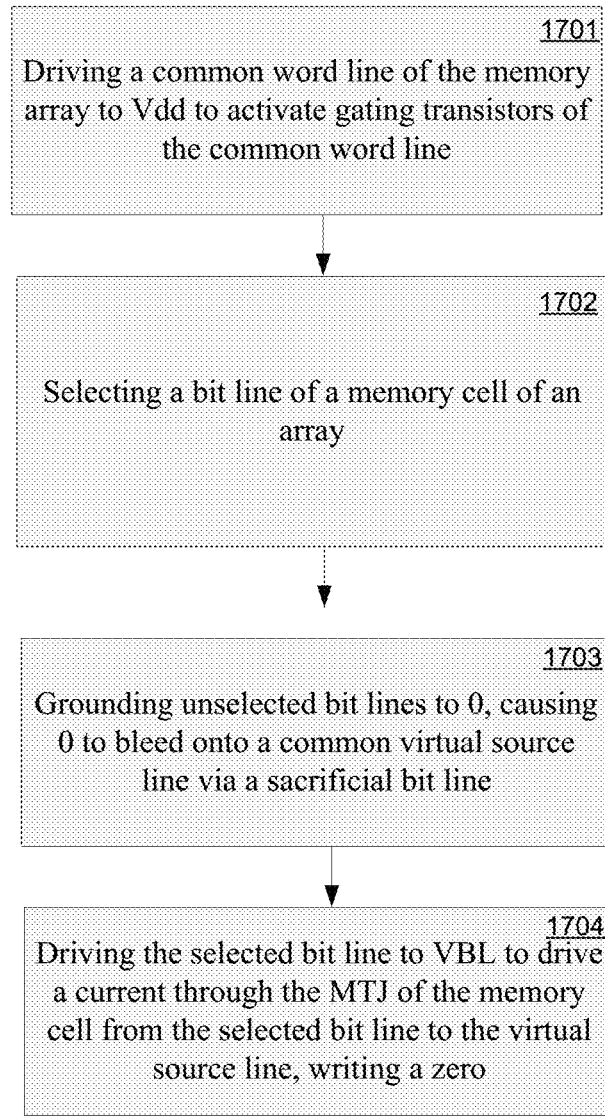
FIG. 17 shows a flow chart of the steps of a process of writing a logical zero into the memory cell for the fourth embodiment of the present invention.

FIG. 17 shows a flow chart of the steps of a process 1700 of writing a zero into the memory cell. Process 1700 begins in step 1701, where a common word line of the memory array is driven to Vdd to activate gating transistors of the common word line. In step 1702, a bit line of the memory cell is selected. In step 1703, unselected bit lines are grounded to zero, causing 0 to bleed onto the common virtual source line via a sacrificial bit line. In one embodiment, this step is optional. This sacrificial bit line can be implemented by a shorted MTJ, a via element, or a straight through direct connection. In step 1704, the selected bit line is driven to VBL to drive a current through the MTJ of the memory cell from the selected bit line to the virtual source line, writing a zero.

Figure 18:
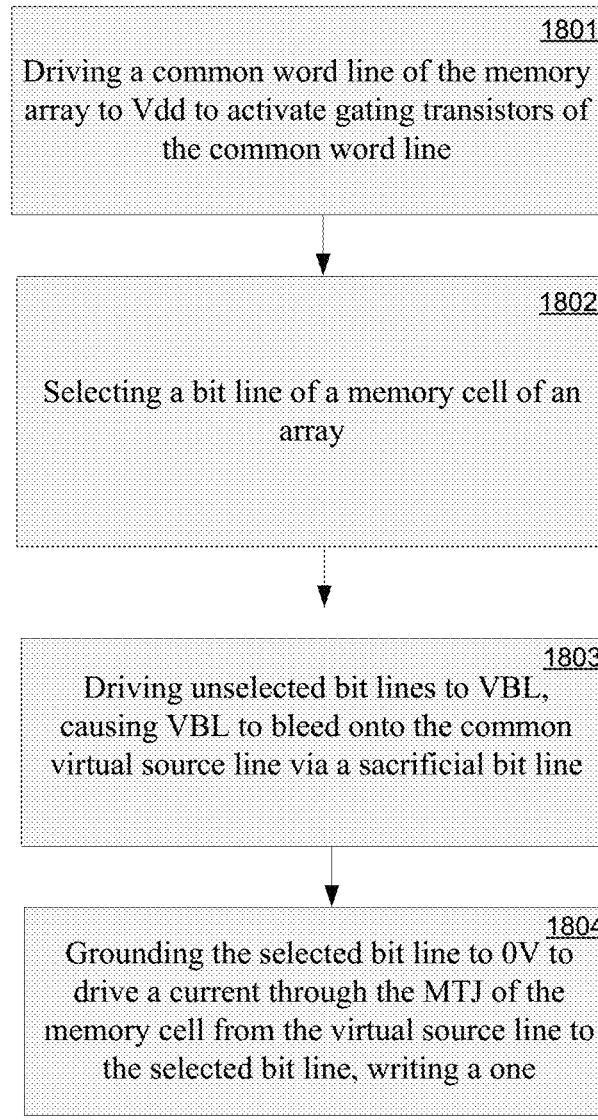
FIG. 18 shows a flow chart of the steps of a process of writing a logical one into the memory cell for the fourth embodiment of the present invention.

FIG. 18 shows a flow chart of the steps of a process 1800 of writing a one into the memory cell. Process 1800 begins in step 1801, where a common word line of the memory array is driven to Vdd to activate gating transistors of the common word line. In step 1802, a bit line of the memory cell is selected. In step 1803, unselected bit lines are driven to VBL, causing VBL to bleed onto the common virtual source line via a sacrificial bit line. In one embodiment, this step is optional. This sacrificial bit line can be implemented by a shorted MTJ, a via element, or a straight through direct connection. In step 1804, the selected bit line is grounded to drive a current through the MTJ of the memory cell from the virtual source line to the selected bit line, writing a one.

Figure 19:
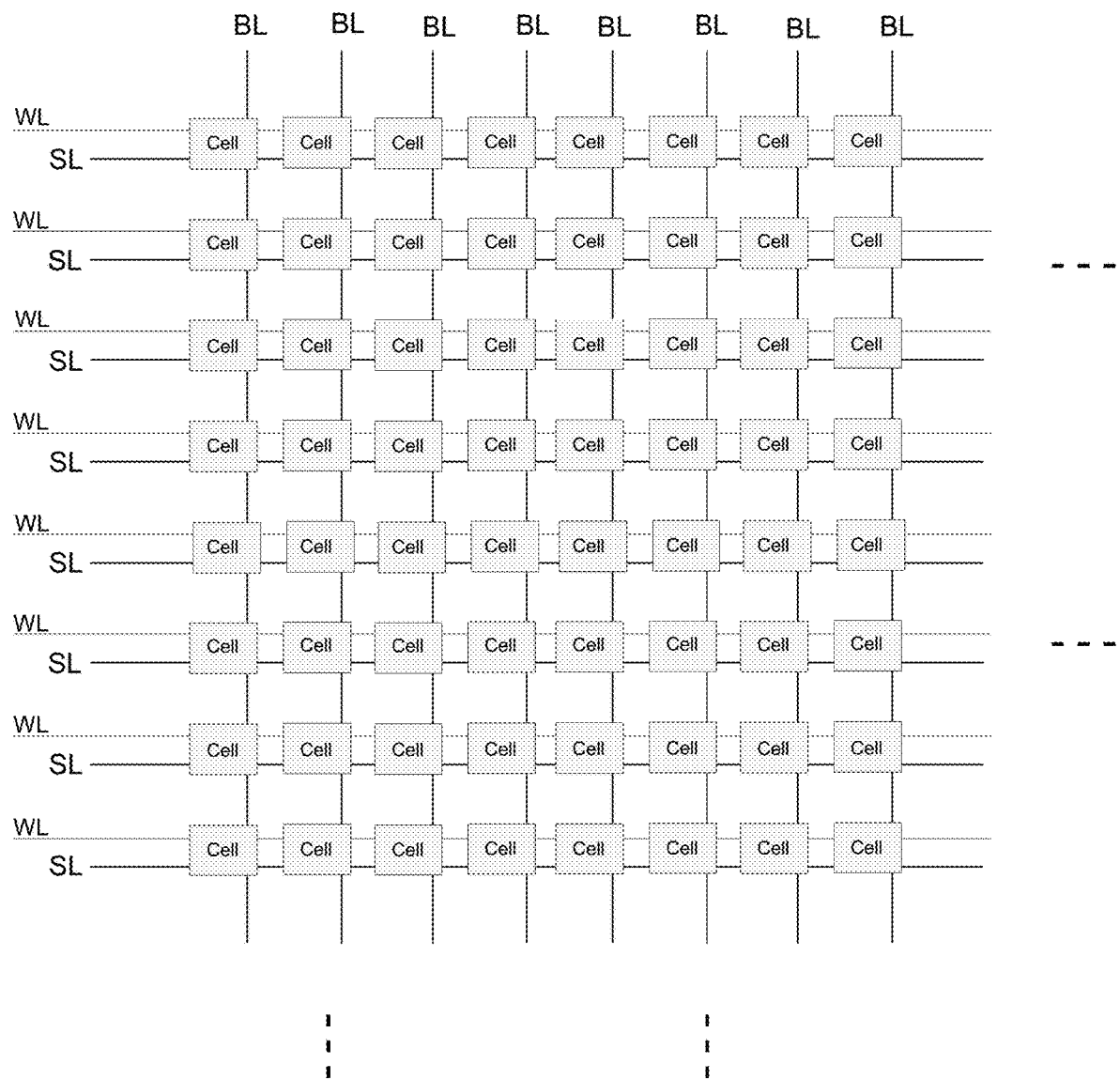
FIG. 19 shows an exemplary portion of an MRAM array in accordance with embodiments of the present invention.

FIG. 19 shows an exemplary portion of an MRAM array 1900 in accordance with embodiments of the present invention. FIG. 19 shows the array 1900 having an array of memory cells and having it's bit lines proceeding from top to bottom of the array and it's source lines and word lines proceeding from left to right horizontally across the array, perpendicular to the bit lines. This perpendicular architecture is featured in each of the previously discussed four embodiments of the present invention. As discussed above, the perpendicular bit line to source line arrangement provides for a smaller cell area requirement, allowing for a tighter pitch from cell to cell by elimination of the conventional dual trace line approach. This architecture avoids the trace line minimum pitch width problems of the conventional dual parallel bit line source line architecture.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device comprising:
    an array of memory cells wherein each memory cell comprises:
        a respective magnetic random access memory (MRAM) element; and
        a respective gating transistor;
    a plurality of bit lines which are routed parallel to each other, wherein each bit line is associated with respective memory cells of said array of memory cells;
    a common word line coupled to gates of gating transistors of said array of memory cells;
    a common source line coupled to sources of said gating transistors, wherein said common source line is routed perpendicular to said plurality of bit lines within said array of memory cells, wherein said common source line biased at a medium voltage;
    a first circuit for providing a first voltage on an addressed bit line of said plurality of bit lines during a write cycle, wherein said addressed bit line corresponds to an addressed memory cell, and wherein said first voltage comprises a voltage between 0V and a high voltage; and
    a second circuit for providing a second voltage on remainder bit lines of unselected memory cells on said common word line, wherein said second voltage is operable to be applied to said common source line through said unselected memory cells, wherein said write cycle stores a logical one into said addressed memory cell when said common bit line is driven to 0V and said source line is driven to the medium voltage, wherein said write cycle stores a logical zero intro said addressed memory cell when said common bit line is driven to a voltage equal to a sum of the medium voltage and the high voltage, and wherein the high voltage is higher than said medium voltage.

2. A memory device as described in claim 1 wherein said second voltage on said common source line is operable to be used in conjunction with said first voltage on said addressed bit line to store a data bit value into said addressed memory cell during said write cycle.

3. A memory device as described in claim 2 wherein a voltage polarity between said first and second voltages during said write cycle defines said data bit value.

4. A memory device as described in claim 1 wherein each respective MRAM element of said memory array is coupled, at a first end thereof, to a respective bit line of said plurality of bit lines, and further coupled, at a second end thereof, to a drain of a respective gating transistor and wherein further said respective gating transistor comprises a gate coupled to said common word line and a source coupled to said common source line.

5. A memory device as described in claim 1 wherein, during said write cycle, said common word line is operable to be active to cause said second voltage to be applied to said common source line through memory cells of said array of memory cells that are associated with said remainder bit.

6. A memory device as described in claim 3 wherein, during said write cycle, said common word line is operable to be active to cause said second voltage to be applied to said common source line through memory cells of said array of memory cells that are associated with said remainder bit lines.

7. A memory device as described in claim 4 wherein, during said write cycle, said common word line is operable to be active to cause said second voltage to be applied to said common source line through memory cells of said array of memory cells that are associated with said remainder bit lines.

8. A method of writing data to a memory device, said method comprising:
    activating a common word line;
    applying a first voltage to an addressed bit line of a plurality of bit lines; and
    applying a second voltage to remainder bit lines of unselected memory cells on said common word line, wherein a data bit value is stored into an addressed memory cell associated with said addressed bit line during a write cycle, and wherein further said memory device comprises:
    an array of memory cells comprising said addressed memory cell, wherein each memory cell of said array of memory cells comprises:
        a respective magnetic random access memory (MRAM) element; and
        a respective gating transistor;
    said plurality of bit lines routed parallel to each other, wherein each bit line is associated with respective memory cells of said array of memory cells;
    a common word line coupled to gates of gating transistors of said array of memory cells;
    a common source line coupled to sources of said gating transistors, wherein said common source line is routed perpendicular to said plurality of bit lines within said array of memory cells, wherein said common source line biased at a medium voltage;
    a first circuit for providing said first voltage on said addressed bit line of said plurality of bit lines during said write cycle, and wherein said first voltage comprises a voltage between 0V and a high voltage; and
    a second circuit for providing said second voltage on said remainder bit lines of said plurality of bit lines, wherein said second voltage is operable to be applied to bias said common source line through said unselected memory cells, wherein said write cycle stores a logical one into said addressed memory cell when said common bit line is driven to 0V and said source line is driven to the medium voltage, wherein said write cycle stores a logical zero intro said addressed memory cell when said common bit line is driven to a voltage equal to a sum of the medium voltage and the high voltage, and wherein the high voltage is higher than said medium voltage.

9. The method as described in claim 8 wherein said second voltage on said common source line is operable to be used in conjunction with said first voltage on said addressed bit line to store a data bit value into said addressed memory cell during said write cycle.

10. The method as described in claim 9 wherein a voltage polarity between said first and second voltages during said write cycle defines said data bit value.

11. The method as described in claim 8 wherein said applying said second voltage to remainder bit lines comprises applying said second voltage to said common source line through memory cells of said array of memory cells that are associated with said remainder bit lines.

12. The method as described in claim 9 wherein said applying said second voltage to remainder bit lines comprises applying said second voltage to said common source line through memory cells of said array of memory cells that are associated with said remainder bit lines.

13. A method for programming a memory device comprising:
    selecting a bit line of a memory cell of an array;
    driving a word line coupled to a gate of a gating transistor to activate the memory cell, wherein unselected bit lines of unselected memory cells on the word line are biased at a medium voltage, causing the medium voltage to bleed onto a common virtual source line of the cell through said unselected memory cells and bias the common virtual source line to the medium voltage, and wherein the selected bit line and the common source line are disposed perpendicularly to one another;
    driving the selected bit line to 0V to program a logical one into the memory cell when said source line is driven to the medium voltage; and
    driving the selected bit line to a voltage equal to a sum of the medium voltage and a high voltage to program a second data value into the memory cell, wherein said high voltage is higher than said medium voltage.

14. The method for programming a memory device as described in claim 13 wherein said desired voltage on said common source line is operable to be used in conjunction with an active bit line of said plurality of bit lines to program a data value into an addressed memory cell of said memory array, wherein said addressed memory cell corresponds to said active bit line.

15. The method for programming a memory device as described in claim 14 wherein said desired voltage on said common source line is ground, and wherein said active bit line is at a voltage lower than ground to program a data value into said addressed memory cell.

16. The method for programming a memory device as described in claim 14 wherein said desired voltage on said common source line is ground, and wherein said active bit line is at a voltage higher than ground to program a data value into said addressed memory cell.

17. The method for programming a memory device as described in claim 14 wherein respective MRAM elements of said memory array are coupled, at a first end thereof, to a respective bit line of said plurality of bit lines, and further coupled, at a second end thereof, to a drain of a respective gating transistor and wherein further said respective gating transistor comprises a gate coupled to said common word line and a source coupled to said common source line.

18. The method for programming a memory device as described in claim 14, wherein the memory cell is part of an array of memory cells, wherein each memory cell of said array of memory cells comprises:
    a respective magnetic random access memory (MRAM) element; and
    a respective gating transistor;
    said plurality of bit lines routed parallel to each other, wherein each bit line is associated with a respective memory cell of said array of memory cells;
    said common word line coupled to gates of gating transistors of said array of memory cells; and said common source line coupled to sources of said gating transistors, wherein said common source line is routed perpendicular to said plurality of bit lines within said array of memory cells.

19. The method for programming a memory device as described in claim 14, wherein the desired voltage is zero volts.

* * * * *